(12) United States Patent
Köllmann et al.

(10) Patent No.: US 10,886,959 B2
(45) Date of Patent: Jan. 5, 2021

(54) APPARATUSES AND METHODS INVOLVING BUFFER CIRCUITS WITH LINEAR TRANSFER FUNCTIONS

(71) Applicant: NXP B.V., Eindhoven (NL)

(72) Inventors: Andreas Johannes Köllmann, Rosengarten (DE); Bernard Burdiek, Halstenbek (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/366,291

(22) Filed: Mar. 27, 2019

(65) Prior Publication Data

US 2020/0313709 A1 Oct. 1, 2020

(51) Int. Cl.
*H04B 1/16* (2006.01)
*H03K 17/687* (2006.01)
*H03F 1/56* (2006.01)
*H03F 3/45* (2006.01)

(52) U.S. Cl.
CPC ............... *H04B 1/16* (2013.01); *H03F 1/565* (2013.01); *H03F 3/45188* (2013.01); *H03K 17/687* (2013.01); *H03F 2200/294* (2013.01); *H03F 2200/451* (2013.01); *H03F 2203/45296* (2013.01); *H03F 2203/45316* (2013.01)

(58) Field of Classification Search
CPC ...... H04B 1/16; H04B 1/1607; H04B 1/1615; H03F 1/56; H03F 1/565; H03F 3/45; H03F 3/45071; H03F 3/45076; H03F 3/45179; H03F 3/45183; H03F 3/45188; H03F 3/45192; H03F 2200/294; H03F 2200/451; H03F 2203/45296; H03F 2203/45316; H03K 17/51; H03K 17/56; H03K 17/687; H03K 17/6871; H03K 17/6872; H03K 17/6874
USPC .................................................. 327/108–112
See application file for complete search history.

(56) References Cited

U.S. PATENT DOCUMENTS

2016/0373062 A1* 12/2016 Mittal ...................... H03F 3/19
2019/0028061 A1* 1/2019 Yeh ......................... H03F 3/193

OTHER PUBLICATIONS

Lopez-Martin, A.J. "Power-efficient class AB CMOS buffer" IEEE Electronics Letters, vol. 45, No. 2, 2 pgs. (Jan. 15, 2009).
Khalaf, K. et al. "60GHz Transmitter Front-End in 40nm LP-CMOS with Improved Back-Off Efficiency", IEEE 13th Tropical Meeting on Silicon Monolithic Integrated Circuits in RF Systems, pp. 6-8 (Jan. 2013).

(Continued)

*Primary Examiner* — Diana J. Cheng
(74) *Attorney, Agent, or Firm* — Rajeev Madnawat

(57) ABSTRACT

Embodiments are directed to a buffer circuit that includes a first circuit and a second circuit. The first and second circuits include sets of transistors along pairs of related signal paths, each of the transistors being driven in response to two related input signals having different but related phases. The first circuit generates a first related output signal in response to one of the pairs of related signal paths and the second circuit generates a second output signal in response to another of the pairs of related signal paths. The first and second circuits provide a linear transfer function across one of the first and one of the second sets of transistors via one of the first pair and second pair of related signal paths.

18 Claims, 4 Drawing Sheets

(56) References Cited

OTHER PUBLICATIONS

Jeong, D. et al. "Ultra-Low Power Direct-Conversion 16 QAM Transmitter Based on Doherty Power Amplifier", IEEE Microwave and Wireless Components Letters, vol. 26, No. 7. pp. 528-530 (Jul. 2016).
"A Transient-Enhanced Low-Quiescent Current Low-Dropout Regulator with Buffer Impedance Attenuation" by Al-Shyoukh et al. published in IEEE Journal of Solid State Circuits, Aug. 2007.
Design of Analog CMOS Integrated Circuits by Behzad Razavi, published at McGraw-Hill.

* cited by examiner

APPARATUSES AND METHODS INVOLVING BUFFER CIRCUITS WITH LINEAR TRANSFER FUNCTIONS

OVERVIEW

Aspects of various embodiments are directed to an apparatus having a buffer circuit with a linear transfer function.

Radio-frequency (RF) transceiver frontends can be used to receive and transmit a dynamic range of RF signals while providing low noise and high linearity. Such RF transceiver frontends typically include a low noise amplifier (LNA), a mixer, a local oscillator (LO), an intermediate frequency (IF) amplifier, and an analog-to-digital converter (ADC). The LNA receives and amplifies an RF signal, the mixer modulates the RF signals with the LO signal, outputting an IF signal. The IF amplifier further amplifies the IF signal before it is input to the ADC for digitization. Maintaining linearity throughout the receiver chain is required for simultaneous reception of different RF signals. In the RF-frequency domain, this can include having the LNA deliver its output signal in a linear manner towards the mixer and the IF amplifier.

These and other matters have presented challenges to efficiencies of buffer circuit implementations, for a variety of applications.

SUMMARY

Various example embodiments are directed to issues such as those addressed above and/or others which may become apparent from the following disclosure concerning buffer circuits that processes input related signals (e.g., differential signals) with a linear transfer function.

In certain example embodiments, aspects of the present disclosure involve a differential buffer circuit that processes differential input signals using pairs of related signal (e.g., current and/or voltage) paths. The voltage is provided along a first of the signal paths and a load current is provided along the second of the signal paths, allowing for linear operation (e.g., linear transfer function) of the buffer circuit and without use of a feedback loop.

In a more specific example embodiment, an apparatus includes a buffer circuit (e.g., a differential buffer circuit) having a first circuit and a second circuit. The first circuit includes a first set of transistors respectively configured along a first pair of related signal paths to process related signals, such as pairs of voltage and current paths. Each of the transistors of the first set are driven in response to two related input signals having different but related phases. The second circuit includes a second set of transistors respectively configured along a second pair of related signal paths also to process the related signals. Each of the transistors of the second set are also driven in response to the two related input signals having different but related phases. For example, respective ones of the transistors of the first set and of the second set are configured to be driven in response to one of the two related input signals and the other of the transistors of the first set and of the second set are configured to be driven in response to the other of the two related input signals. The first circuit generates a first related output signal in response to one path of the first pair of related signal paths and the second circuit generates a second output signal in response to one path of the second pair of related signal paths. The first and second output signals correspond to the two related input signals having different but related phases. The first and second circuits are configured and arranged to provide a linear transfer function across one of the first and one of the second sets of transistors via one of the first pair and one of the second pair of related signal paths corresponding with the other of the first and second sets of transistors.

In various embodiments, the above-described apparatus includes various additional components. For example, the apparatus includes circuitry configured to generate output signals for use as the two related input signals, such as a low-noise amplifier (LNA). The generated output signals correspond to an amplified version of a differential pair of signals. As provided above, the two related input signals can correspond to a differential input signal. The apparatus further includes a load to be driven by the first and second output signals. The load, as further described herein, can be mainly resistive or inductive. Additionally and/or alternatively, at least one of the first circuit and the second circuit includes a respective resistive circuit in or along an associated one of the pairs of related signal paths. The respective resistive circuit is configured to mimic a scaled version of the load and/or is set to a resistance value according to parameters associated with the load. In various embodiments in which the load is mainly inductive, at least one of the first circuit and the second circuit includes a respective inductive circuit in or along an associated one of the pair of related signal paths.

The two related input signals, in a number of embodiments, include a differential pair of signals. The first circuit and the second circuit provide the first and second output signals along an associated ones of the first and second pairs of related signal paths without a feedback loop. For example, the first circuit and the second circuit provide the first and second output signals along an associated one of the pairs of related signal paths with low or minimal output impedance and/or without a feedback loop. Each of the first and second circuits can be configured and arranged to deliver the load current along the respective one signal path of each of the first and second sets of related pairs of signal paths and provide voltage transfer along the other signal path of each of the first and second sets that corresponds to the one of the first and second sets of transistors with the linear transfer function thereacross.

In a number of embodiments, the first set and second set of transistors can include field-effect transistors (FETs). Each of the FETs is configured as a source-follower transistor having a gate, the source-follower transistors being configured to respond to a respective one of the two related signals. Additionally, the first set of FETs is respectively configured with the first pair of related signal paths in a first current mirror arrangement and/or the second set of FETs is respectively configured with the second pair of related signal paths in a second current mirror arrangement. For example, the buffer circuit includes the first pair of related (e.g., current) signal paths in the first current mirror arrangement and the second pair of related (e.g., current) signal paths in the second current mirror arrangement, and each of the first circuit and the second circuit further includes a resistor coupled to the first and second current mirror arrangement. The source-followers isolate the resistors from the circuitry configured to generate output signals for use as the two related input signals, as further described herein.

In another specific example embodiment and/or in accordance with the above-described embodiments, the apparatus further includes a load and the buffer circuit includes a resistive circuit. The load is configured and arranged to be driven by the first and second output signals. At least one of the first circuit and the second circuit includes the resistive circuit that includes resistor and, optionally, a capacitor arranged in or along an associated one of the pairs of related signal paths configured and arranged to mimic a scaled version of the load to be driven by the first and second related output signals. For example, the first and/or second circuits include a capacitor and a respective resistor in or along an associated one of pairs of related (first and second) signal paths, wherein said respective resistor is set to a resistance value according to parameters associated with the load. A capacitor is configured and arranged in parallel to the respective resistor to compensate for signal delay and to, at least partially, account for impedance and capacitance attributable to the load. In other embodiments and/or in addition, the buffer circuit includes one or more inductive circuits, such as an inductor in place of the resistor or in series or parallel with the resistor, wherein the inductor is set to an inductance value according to parameters associated with the load.

In various related embodiments, both the first circuit and the second circuit further include a respective resistive circuit in or along associated ones of the first and second pairs of related signal paths. The resistive circuits are set to a resistance value according to parameters associated with the load, as described above. The circuit further includes a current source circuit (e.g., a floating current source) configured and arranged in parallel to the respective resistive circuit and to mitigate a voltage drop across the respective resistive circuit.

In accordance with a number of example embodiments, the above-described circuits include a circuitry to generate output signals and a bias circuit. The circuitry, such as an LNA, is configured to generate output signals for use as input signals corresponding to the pair of differential input signals and a low dropout (LDO) regulator configured to regulate the output signals using a reference voltage signal. The bias circuit is configured with the first and second circuits and the LDO regulator to provide the reference voltage signal to the LDO regulator that is based on a voltage drop of the first and second pair of related signal paths.

In a number of specific embodiments, the first circuit includes, in or along a first of the first pair of related signal paths, a first (source-follower) FET, a first resistive circuit, and a first pair of FETs. The first pair of FETs are arranged in a first current mirror arrangement and configured to provide a load current in response to a first of the two related input signals and along the first of the first pair of related signal paths. The first circuit further includes, in or along a second of the first pair of related signal paths, a second (source-follower) FET configured to provide a voltage signal in response to a second of the two related input signals and along the second of the first pair of related signal paths, wherein the load current is provided to a source terminal of the second FET. The second circuit includes, in or along a first of the second pair of related signal paths, a third (source-follower) FET, a second resistive circuit, and a second pair of FETs. The second pair of FETs are arranged in a second current mirror arrangement and configured to provide another load current in response to the second of the two related input signals and along the first of the second pair of related signal paths. The second circuit further includes, in or along a second of the second pair of related signal paths, a fourth (source-follower) FET configured to provide another voltage signal in response the first of the two related input signals and along the second of the second pair of related signal paths, wherein the other load current is provided to a source terminal of the fourth FET. The current through the second FET of the first circuit and the fourth FET of the second circuit can be constant or near constant, with the load current being provided via the firsts of the first and second pairs of related signal paths. As the drain source current of the second FET of the first circuit and the fourth FET of the second circuit (e.g., which provide the output signals) are constant or near constant, the circuit can implement linear operation.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
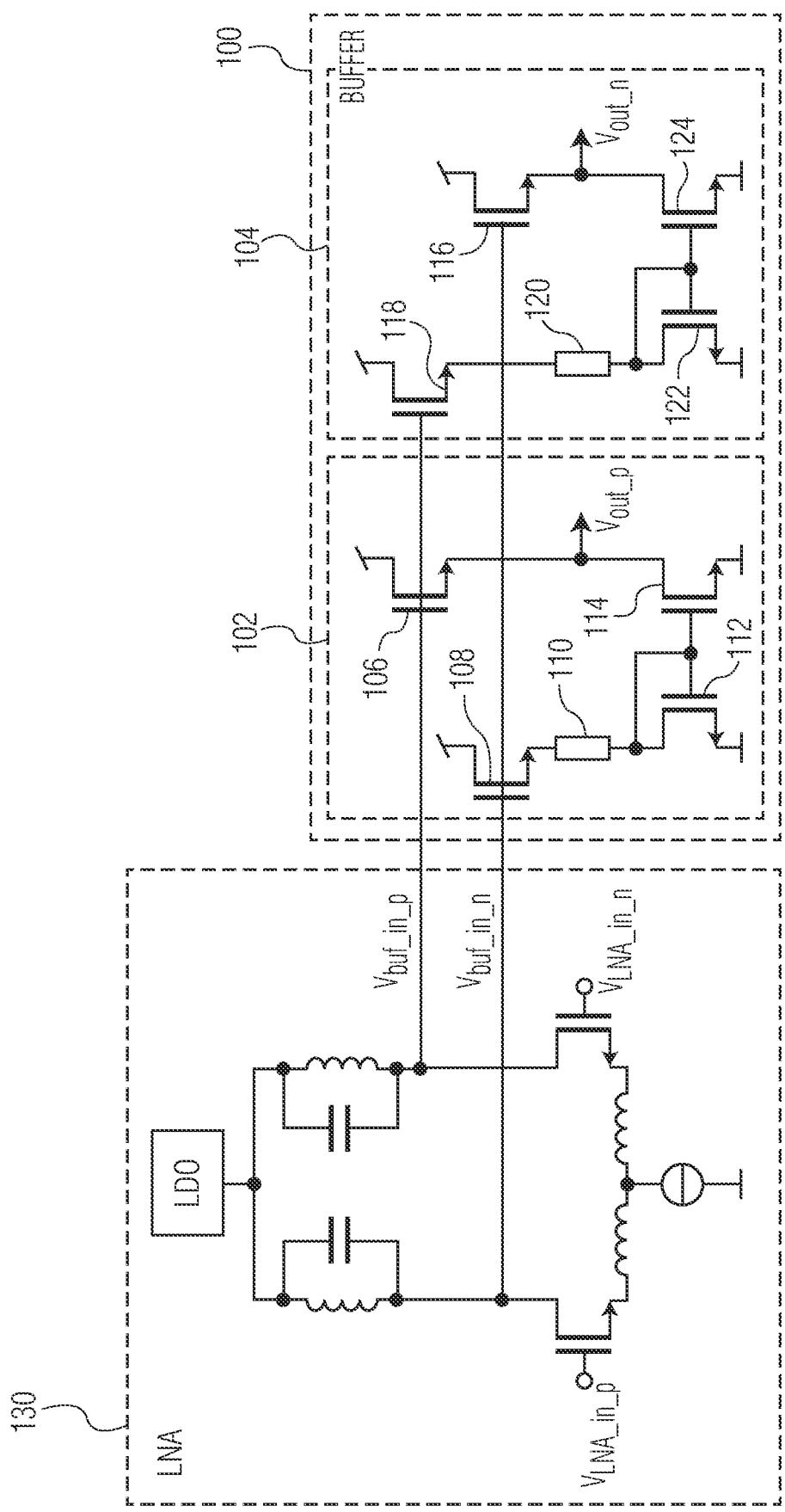
FIG. 1 illustrates an example apparatus including a buffer circuit, in accordance with the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving a buffer circuit that processes input related signals (e.g., differential signals) along a first pair of related signal paths and a second pair of related signal paths. In certain implementations, aspects of the present disclosure have been shown to be beneficial when used in the context of a differential buffer circuit that processes each input differential pair of signals using pairs of related signal paths. In some embodiments, the voltage is provided along a first of the signal paths and a load current is provided along the second of the signal paths and allowing for linear operation of the buffer circuit and without use of a feedback loop. While not necessarily so limited, various aspects may be appreciated through the following discussion of non-limiting examples which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Embodiments in accordance with the present disclosure are directed to apparatuses having buffer circuits for use in a high-frequency RF-receiver that provides linearity in a low-noise amplifier (LNA) of the radio-frequency (RF)-receiver. The buffer circuit, provides output signals to a load in a linear manner. The output signals are provided without a feedback loop, which allows for threshold circuit performance, stability, as well as temperature and supply voltage variations. The buffer circuit provides the linear output signals using a feed-forward current path that achieves the linearity without the feedback loop. As the buffer circuit can follow an LNA, it can be referred to as a source-following buffer. The linear operation of the buffer circuit can be achieved by keeping the drain source current of transistors of the buffer circuit constant or near constant using a feed-forward current path. The feed-forward current path provides the load current to the source-node of the transistor that provides the output signal. As may be appreciated, embodiments are not limited to use with an LNA and can include other circuitry that generates output signals in response to an input signal.

A number of embodiments are directed to an apparatus that includes a buffer circuit. The buffer circuit includes a first circuit and a second circuit. The first circuit includes a first set of transistors respectively configured along a first pair of related signal paths to process related signals. Each of the transistors of the first set are driven in response to two related input signals having different but related phases. The second circuit includes a second set of transistors respectively configured along a second pair of related signal paths also to process the related signals. Each of the transistors of the second set are also driven in response to the two related input signals having different but related phases. For example, respective ones of the transistors of the first set and of the second set are driven in response to one of the two related input signals and the other of the transistors of the first set and of the second set are driven in response to the other of the two related input signals. The first circuit generates a first related output signal in response to one path of the first pair of related signal paths and the second circuit generates a second output signal in response to one path of the second pair of related signal paths. The first and second circuits thereby provide a linear transfer function across one of the first and one of the second sets of transistors via one of the first pair and one of the second pair of related signal paths corresponding with the other of the first and second sets of transistors.

The two related input signals, in a number of embodiments, include differential signals, e.g., a differential pair of signals. The first circuit and the second circuit provide the first and second output signals along associated ones of the pairs of related signal paths without a feedback loop. In various embodiments, each of the pair of signal paths include a voltage path and a current path as further described herein. For example, the first circuit and the second circuit provide the first and second output signals along associated ones of the pairs of related signal paths with low or minimal output impedance and/or without a feedback loop. In specific embodiments, each of the first and second circuits deliver the load current along a respective signal path of each of the first and second sets of related pairs of signal paths and provide voltage transfer along the other signal path of each of the first and second sets that corresponds to the one of the first and one of the second sets of transistors with the linear transfer function thereacross.

In a number of embodiments, the first set and second set of transistors include field-effect transistors (FETs). Each of the FETs is configured as a source-follower transistor having a gate, the source-follower transistors responding to a respective one of the two related signals. Additionally, the first set of FETs is respectively configured with the first pair of related signal paths in a first current mirror arrangement and/or the second set of FETs is respectively configured with the second pair of related signal paths in a second current mirror arrangement. For example, the circuit includes the first pair of related signal paths in the first current mirror arrangement and the second pair of related signal paths in the second current mirror arrangement, and each of the first circuit and the second circuit further includes a resistor coupled to the first and second current mirror arrangement. At least a portion of the source-follower transistors isolate the resistors from the source, such as an LNA, as further described herein.

As a specific example and in accordance with various embodiments, the first circuit includes, in or along a first of the first pair of related signal paths, a first FET, a first resistive circuit, and a first pair of FETs. The first pair of FETs is arranged in a first current mirror arrangement and provides a load current in response to a first of the two related input signals and along the first of the first pair of signal paths. The first circuit further includes, in or along a second of the first pair of related signal paths, a second FET that provides a voltage signal (as the output signal) in response to a second of the two related input signals and along the second of the first pair of the related signal paths, wherein the load current is provided to a source terminal of the second FET. The second circuit includes, in or along a first of the second pair of related signal paths, a third FET, a second resistive circuit, and a second pair of FETs. The second pair of FETs are arranged in a second current mirror arrangement and provides another load current in response to the second of the two related input signals and along the first of the second pair of the related signal paths. The second circuit further includes, in or along a second of the second pair of the related signal paths, a fourth FET that provides another voltage signal in response the first of the two related input signals and along the second of the second pair of related signal paths, wherein the other load current is provided to a source terminal of the fourth FET. The current through the second FET of the first circuit and the fourth FET of the second circuit can be constant or near constant, with the load current being provided via the first of the first and second pairs of related signal paths. As the drain source current of the second FET of the first circuit and the fourth FET of the second circuit (e.g., which provide the output signals) are constant or near constant, the circuit can implement linear operation.

The above-described circuit can include various additional components. For example, the circuit can further include circuitry that generates output signals for use as the two related input signals. As provided above, the two related inputs signals can correspond to a differential input signal. The circuit further includes a load that is driven by the first and second output signals. For example, at least one of the first circuit and the second circuit includes a respective resistive circuit in or along an associated one of the pairs of related signal paths. The resistive circuit can include a resistor and, optionally, a capacitor arranged in or along an associated one of the related signal paths configured and arranged to mimic a scaled version of the load to be driven by the first and second related output signals. The respective resistive circuit is set to a resistance value according to parameters associated with the load. In other embodiments and/or in addition, at least one of the first circuit and the second circuit includes an inductive circuit.

In another specific example embodiment and/or in accordance with the above-described embodiments, the circuit further includes the load driven by the first and second output signals, a resistor, and a capacitor. At least one of the first circuit and the second circuit includes a respective resistor in or along an associated one of the pairs of related signal paths, wherein said respective resistor is set to a resistance value according to parameters associated with the load. A capacitor is configured and arranged in parallel to the respective resistor (e.g., the resistor of the resistive circuit) to compensate for signal delay and to, at least partially, account for impedance and capacitance attributable to the load. In specific embodiments, both the first circuit and the second circuit include a respective resistive circuit in or along an associated one of the first pair and one of the second pair of related signal paths. The resistive circuits are both set to a resistance value according to parameters associated with the load. The circuit further includes a current source circuit (e.g., a floating current source) configured and arranged in parallel to the respective resistive circuit and to mitigate a voltage drop across the respective resistive circuit.

In accordance with a number of example embodiments, the above-described circuits include the LNA and a bias circuit. The LNA includes circuitry that generates output signals for use as input signals corresponding a differential pair of signals and a low dropout (LDO) regulator that regulates the output signals using a reference voltage signal. The bias circuit is configured with the first and second circuits and the LDO regulator to provide the reference voltage signal to the LDO regulator that is based on a voltage drop of the first and second pairs of the related signal paths.

The above described circuit embodiments can be used to implement linear operation by keeping the drain/source current of the transistors, which provide the output voltage, constant or near constant using a feed-forward current path. The linear operation is provided without the use of a feedback loop that senses the drain current of the source-follower transistors and prevents stability issues caused by the feedback loop. In such above described embodiments, the feed-forward current path is used to deliver the load current, releasing the source-follower transistors from delivering the load current and resulting in a linear transfer function characteristic of the source-follower transistors. The circuitry can include additional source-follower transistors, resistive circuitry, and current mirror arrangements arranged in or along the feed-forward current path and used to deliver the load current. Proper design of the resistive value (and optionally, capacitive value of a capacitive circuit arranged in parallel with the resistive circuitry and/or resistor) allows for adjusting the amplitude and phase of the load current for matching the output voltage and the load.

Turning now to the figures, FIG. 1 illustrates an apparatus including a buffer circuit, in accordance with the present disclosure. As shown, the buffer circuit 100 includes a first circuit 102 and a second circuit 104. The apparatus, which includes an arrangement of circuits, further includes circuitry that generates an output signals in response to an input signal, such as an LNA 130. The buffer circuit 100 follows the LNA 130 (or other circuitry in various embodiments), and can be referred to as a source-following buffer. The buffer circuit 100 provides a low output impedance without a feedback loop by utilizing the differential manner of many integrated circuits. As may be appreciated, many circuits use differential signals. Differential signals have two related input signals that have different but related phases, e.g., a differential pair of signals that are out of phase with one another by 180 degrees and have the same amplitude. The buffer circuit 100 provides output differential signals to the next stage, such as an input of a mixer, an attenuator and/or another amplifier block.

The first circuit 102 includes a first set of transistors 106, 108 along a first pair of related signal paths to process related signals. Each transistor 106, 108 of the first set is driven in response to related input signals (e.g., $V_{buf\_in\_p}$ and $V_{buf\_in\_n}$) having different but related phases. Similarly, the second circuit 104 includes a second set of transistors 116, 118 along a second pair of related signal paths that process the related signals. Each transistor 116, 118 of the second set is driven in response to the related input signals (e.g., $V_{buf\_in\_p}$ and $V_{buf\_in\_n}$). In various embodiments, each of the pair of related signal paths includes a current path and a voltage path. For example, the transistors 106, 118 define the output voltage signal and the transistors 108, 116 (along with resistors and current mirrors as further described below) define the load current. As may be appreciated, each of the transistors can be FETs, such as n-type metal-oxide-semiconductor (NMOS) and/or p-type metal-oxide-semiconductor (PMOS) transistors, although embodiments are not so limited. With PMOS transistors, the circuit is built completely complementary, with the supply and ground being flipped from that illustrated by FIG. 1. Additionally, the order of the input signals, $V_{buf\_in\_p}$ and $V_{buf\_in}$, and/or the transistors is not limited to that illustrated by FIG. 1, and be in various orders.

As further described herein, respective ones of the transistors of the first set 106, 108 and of the second set 116, 118 are driven in response to one of the two related input signals (e.g., transistors 106, 118 driven by $V_{buf\_in\_p}$) and the other of the transistors of the first set and of the second set being configured to be driven in response to the other of the two related input signals (e.g., transistors 108, 116 driven by $V_{buf\_in\_n}$). The first circuit 102 generates a first related output signal (e.g., $V_{out\_p}$) in response to one path of the first pair of related signal paths. As further illustrated and described herein, the first circuit 102 generates a load current in response to the other path of the first pair of related signal paths, with the load current being provided to a source terminal of the transistor 106 that provides the first related output signal. The second circuit 104 generates a second related output signal (e.g., $V_{out\_n}$) in response to one path of the second pair of related signal paths. Similarly to the first circuit 102, the second circuit 104 generates another load current in response to the other path of the second pair of related signal paths, with the other load current being provided to a source terminal of the transistor 116 that provides the second related output signal. The first and second related output signals (e.g., voltages) correspond to the two related input signals having different but related phases.

The first and second circuits 102, 104 are configured and arranged to provide a linear transfer function across one of the first and one of the second sets of transistors 106, 116 via one of the first pair and second pair of related signal paths corresponding with the other of the first and second sets of transistors 108, 118. One of the paths of the first and second pair of related signal paths provides a (load) voltage of the related output signals and the other of the paths provides the load current. In this manner, each of the first and second circuits 102, 104 deliver the load current along a respective current path of each of the first and second sets of related pairs of signal paths and provide voltage transfer along a respective voltage path of each of the first and second sets that corresponds to the one of the first and second sets of transistors 106, 116 with a linear transfer function thereacross.

As shown by FIG. 1, in various related embodiments, the apparatus further includes circuitry that generates output signals for use as the two related input signals (e.g., $V_{buf\_in\_p}$ and $V_{buf\_in\_n}$), such as the illustrated LNA 130 having the circuitry. For example, the LNA 130 includes circuitry that generates output signals for use as input signals corresponding to the differential input signals, and which correspond to amplified versions of the differential input signals. Although not illustrated, the apparatus can further include a load to be driven by the first and second related output signals. The load ($Z_{load}$ of FIG. 3) is driven by the first and second related output signals ($V_{out\_p}$ and $V_{out\_n}$) of the buffer circuit 100, wherein the first circuit 102 and the second circuit 104 of the buffer circuit 100 provide the first and second related output signals along an associated one of the related signal paths (e.g., current and voltage paths) with low or minimal output impedance and/or without a feedback loop. As may be appreciated, embodiments are not limited to an LNA, and can include other types of circuits that deliver the input signals to the buffer circuit 100.

As illustrated and further described below by FIG. 2, at least one of the first circuit 102 and the second circuit 104 include a respective resistive circuit 110, 120 and a current mirror arrangement (e.g., transistors 112, 114 and 122, 124) in or along an associated one of the related signal paths. The resistive circuit 110, 120 are coupled to the current mirror arrangements. The one or more resistive circuits 110, 120 include a resistor (and in some embodiments, a capacitor) arranged in or along an associated one of the related signal paths configured and arranged to mimic a scaled version of the load to be driven by the first and second related output signals. The one or more resistive circuits 110, 120 (e.g., the resistor) are set to a resistance value according to parameters associated with the load. The resistive circuits 110, 120 are configured with at least a portion of the transistors of the first set 106, 108 and of the second set 116, 118. As further illustrated, the first set of transistors (e.g., FETs) 106, 108 is respectively configured with the first pair of related signal paths in a first current mirror arrangement (e.g., transistors 112, 114) and/or the second set of transistors (e.g., FETs) 116, 118 is respectively configured with the second pair of related signal paths in the second current mirror arrangement (e.g., transistors 122, 124).

In a number of related embodiments, although not illustrated by FIG. 1, at least one of the first circuit 102 and the second circuit 104 includes an inductive circuit. The load, for example, may be mainly inductive. In such embodiments, the inductive circuit can include one or more inductors that replace the resistive circuit 110, 112. The apparatus of claim 1, further including a load configured and arranged to be driven by the first and second related output signal. The load, in some embodiments, is mainly inductive. The respective inductive circuit is set to an inductance value according to parameters associated with the load. In other embodiments, the inductive circuit includes a series or parallel inductor added to the resistive circuits 110, 120.

The first set and second set of transistors of the first and second circuits 102, 104 include source-follower transistors 106, 108, 116, 118 that have a gate coupled to one of the two related input signals to get a response at their respective source terminals. The first current mirror arrangement (e.g., transistors 112, 114) and a second current mirror arrangement (e.g., transistors 122, 124) are coupled to the source-follower transistors 106, 108, 116, 118. The resistive circuits 110, 120 can be used as an input to the first current mirror arrangement (e.g., transistors 112, 114) and the second current mirror arrangement (e.g., transistors 122, 124), as further described herein. The source-follower transistors (e.g., transistors 108, 118) isolate the resistive circuits 110, 120 from the circuitry (e.g., the LNA 130) configured to generate output signals for use as the two related input signals. Linear operation of the first and second circuits 102, 104 (e.g., the linear transfer function) is provided by keeping the drain/source current of the source-follower transistors, that provide the respective output signals (e.g., transistors 106 and 116), constant or near constant using a feed-forward current path associated with the other source-follower transistors (e.g., transistors 108, 118), the resistive circuits 110, 120 and the current mirror arrangements (e.g., transistors 112, 114, 122, 124).

Figure 2:
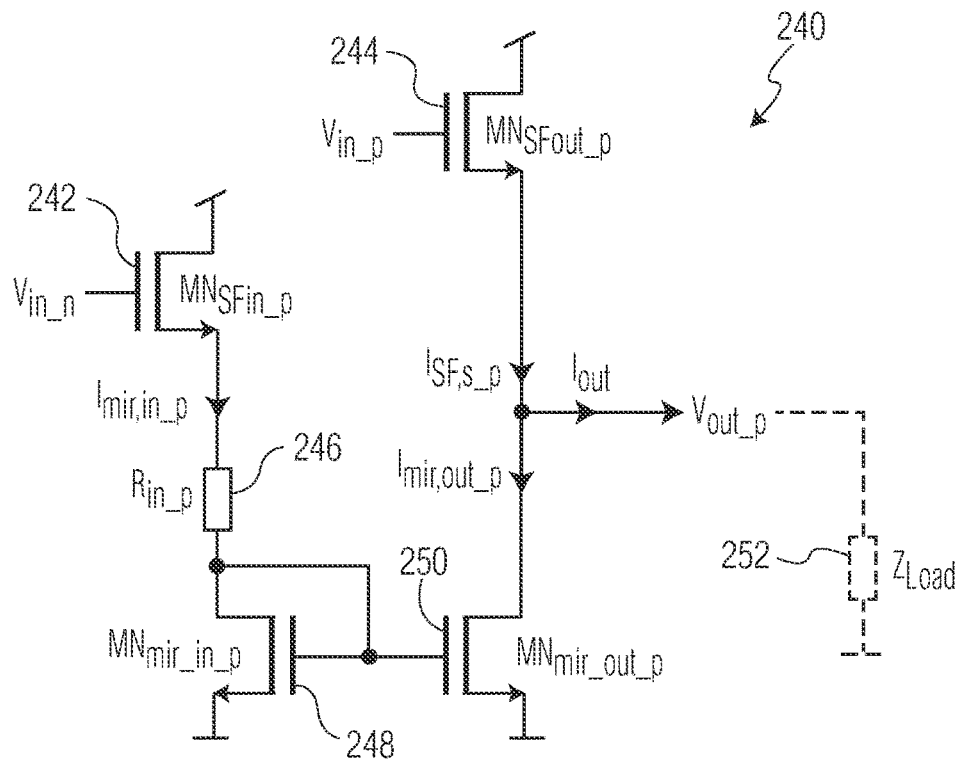
FIG. 2 illustrates an example buffer circuit and resulting signal paths for the circuit type implemented in a manner consistent with FIG. 1, in accordance with the present disclosure.

FIG. 2 illustrates an example buffer circuit and resulting signal paths for a buffer circuit type implemented in a manner consistent with FIG. 1, in accordance with the present disclosure. More specifically, and for simplicity purposes, FIG. 2 shows one half (e.g., the first circuit 102) of the buffer circuit 100 illustrated by FIG. 1. The other half (e.g., the second circuit 104) operates in the same manner but with opposite phase signals of the according differential signal, as described below. As may be appreciated, the input signals $V_{in\_p}$ and $V_{in\_n}$ are differential signals (e.g., differential pair of signals) having the same signal amplitude but that are 180 degrees phase-shifted from each other.

The first circuit 240, as described above, includes the first circuit 102 illustrated by FIG. 1. The first circuit 240 has a first set of transistors (e.g., FETs) respectively configured along a first pair of related signal paths to process the related input signals $V_{in\_p}$ and $V_{in\_n}$. Each of the transistors are configured to be driven in response to the two related input signals $V_{in\_p}$ and $V_{in\_n}$.

As previously described, respective transistors of the first set are driven in response to one of the two related input signals and the other of the transistors of the first set are driven in response to the other of the two related input signals. The first set of transistors includes transistors 242, 244 that are configured as source-follower transistors having a gate coupled to a respective one of the two related signals to get a response at their respective source terminals. The first circuit 240 further includes a first current mirror arrangement (e.g., transistors 248, 250), as further described herein.

The first circuit 240 generates a first related output signal ($V_{out\_p}$) in response to one of the first pair of related signal paths. As described below, the other of the first pair of related signal paths provides a load current. As shown, a load is coupled to the first circuit 240 and driven by the first output signal. The first circuit 240 further includes a resistive circuit 246 arranged with the first current mirror arrangement (e.g., transistors 248, 250) in or along the other of the first pair of related signal paths. The resistive circuit 246 mimics (or otherwise uses) a scaled version of the load to be driven by the first output signal. The resistive circuit 246 is set to a resistive value according to parameters associated with the load. As previously described, various embodiments can further or alternatively include an inductive circuit in place of or in addition to the resistive circuit 246.

As described above, the transistors 242 and 244 act as source-followers. For ease of reference, the transistors 242, 244 are referred to herein as "source-follower transistors." The first source-follower transistor 244 responds to the input signal $V_{in\_p}$ by providing the output signal to the load (e.g., load impedance, $Z_{load}$ 252). The first source-follower transistor 244 determines the voltage at the output terminal $V_{out\_p}$. The first source-follower transistor 244 may not provide the signal current $I_{out}$ into the load impedance (e.g. $Z_{load}$ 252). The second source-follower transistor 242 provides the other input signal $V_{in\_n}$ to the series-connected resistive circuit 246 which provides an input to the first current mirror arrangement (e.g., to input diode $MN_{mir\_in\_p}$ 248). If the resistor value of the resistive circuit 246 is larger than the output impedance 1/gm of the second source-follower transistor 242 and the input impendence 1/gm of the diode-connected transistor 248 of the first current mirror arrangement, the signal current swing is determined by the resistor value. And, if the resistor value $R_{in\_p}$ is dominant compared to the source follower impendence of the second source-follower transistor 242, the branch current $I_{mir,in\_p}$ can show less non-linearity and the currents into and out of the first current mirror arrangement can exhibit small distortion.

In accordance with various embodiments, including those described above, the resistor value $R_{in\_p}$ and the current mirror ratio of $MN_{mir\_in\_p}:MN_{mir\_out\_p}$ determine the current swing of $I_{mir\_out\_p}$. The resistor value is chosen for the load impedance, $Z_{load}$ 252, the load current $I_{out}$ is delivered by the first current mirror arrangement and the current $I_{SF,s\_p}$ through the first source-follower transistor 244 remains near constant or constant. By keeping $I_{SF,s\_p}$ constant or near constant, the voltage transfer from $V_{in\_p}$ to $V_{out\_p}$ may not experience significant distortion caused by the non-linear dependency between $V_{GS}$ and $I_{DS}$ of the first source-follower transistor 244. The resistor value $R_{in\_p}$ can be adjusted to reflect the load impedance. Additionally, the current mirror ratio provides a degree of freedom such that the resistor value $R_{in\_p}$ can be chosen larger in order to reduce an $I_{mir\_in\_p}$ to save current in the feed-forward branch.

As may be appreciated, the buffer circuit illustrated by FIG. 2 can include a second circuit which operates similarly to the first circuit 240 albeit to provide $V_{out\_n}$. The second circuit includes a second set of transistors. The second set includes a first and second source-follower transistors. The second circuit further includes a second current mirror arrangement. The first source-follower transistor of the second circuit responds to the input signal $V_{in\_n}$ by providing another output signal to the load. More specifically, the first source-follower transistor of the second circuit determines the voltage at the output terminal $V_{out\_n}$. The first source-follower transistor may not provide the signal current but into the load impedance (e.g., $Z_{load}$ 252). The second source-follower transistor of the second circuit provides the other input signal $V_{in\_p}$ to a series-connected resistive circuit which provides an input to the second current mirror arrangement (e.g., to input diode $MN_{mir\_in\_n}$). If the resistor value of the resistive circuit is larger than the output impedance 1/gm of the second source-follower transistor and the input impedance 1/gm of the diode-connected transistor of the second current mirror arrangement, the signal current swing is determined by the resistor value. And, if the resistor value $R_{in\_n}$ is dominant compared to the source follower impedance of the second source-follower transistor, the branch current $I_{mir,in\_n}$ can show less non-linearity and the currents into and out of the second current mirror arrangement can exhibit small distortion.

In accordance with the above described embodiments, the first circuit 240 (and second circuit) provide the first output signal (and second output signal) along an associated one of the pairs of related signal paths with low or minimal output impedance and without a feedback loop. For example, a load is to be driven by the first and second output signals, and the first circuit 240 and the second circuit provide the first and second output signals along an associated one of the pair of related signal paths (e.g., a feed-forward current path) with the low or minimal output impedance.

Figure 3:
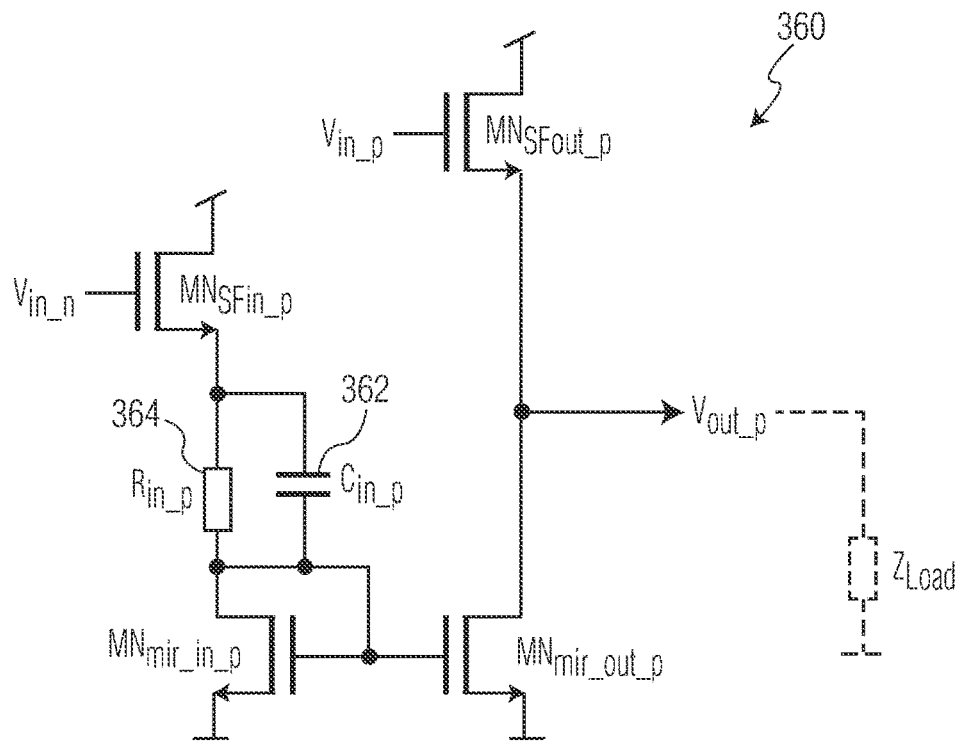
FIG. 3 illustrates an example buffer circuit and resulting signal paths, in accordance with the present disclosure.

FIG. 3 illustrates an example buffer circuit and resulting signal paths, in accordance with the present disclosure. The buffer circuit 360, similarly to FIG. 2, shows one half (e.g., the first circuit 102) of the buffer circuit 100 illustrated by FIG. 1. The components are the same as previously described by FIG. 1 with the addition of a capacitor 362 that is in parallel with the respective resistive circuit (e.g., resistor 364). As described further below, the capacitor 362 compensates for signal delay and at least partially accounts for impedance and capacitance attributable to the load (e.g., load impedance $Z_{load}$).

In accordance with the above described and more specific embodiments, a capacitor 362 is added in parallel to the resistor 364. The capacitor 362 compensates for delay caused by one of the related signal paths (e.g., the current path or branch $MN_{SFin\_p}$ to $R_{in\_p}$ to $MN_{mir\_in\_p}$ to $MN_{mir\_out\_p}$) with respect to the other related signal path (e.g., voltage path $MN_{SFout\_p}$). As the resistor value $R_{in\_p}$ can mimic the load impedance, $C_{in\_p}$ can also mimic the (parasitic) capacitance part of the load. A number of embodiments, as previously described, further or alternatively include an inductive circuit in place of or in addition to the resistor 364.

In embodiments that involve shorting a delay through one of the related signal paths (e.g., the feed-forward current path), it can be beneficial to connect the top plate of the capacitor 362 to the input node $V_{in\_n}$. This can cut-off the delay of $MN_{SFin\_p}$ but can also impact the capacitance experienced by and dynamic current drawn from the LNA-load.

Figure 4A:
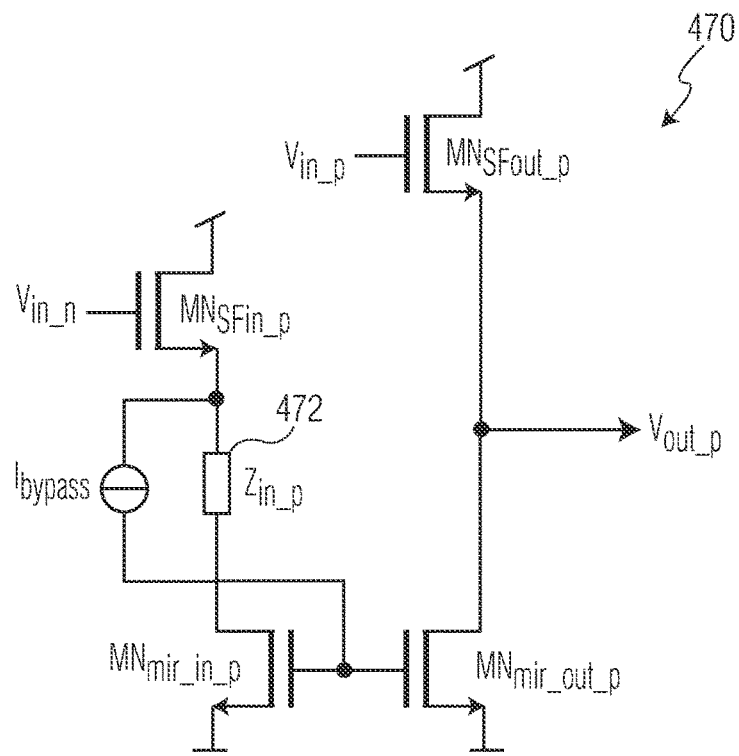
FIGS. 4A-4B illustrate example buffer circuits and resulting signal paths, in accordance with the present disclosure.
Figure 4B:
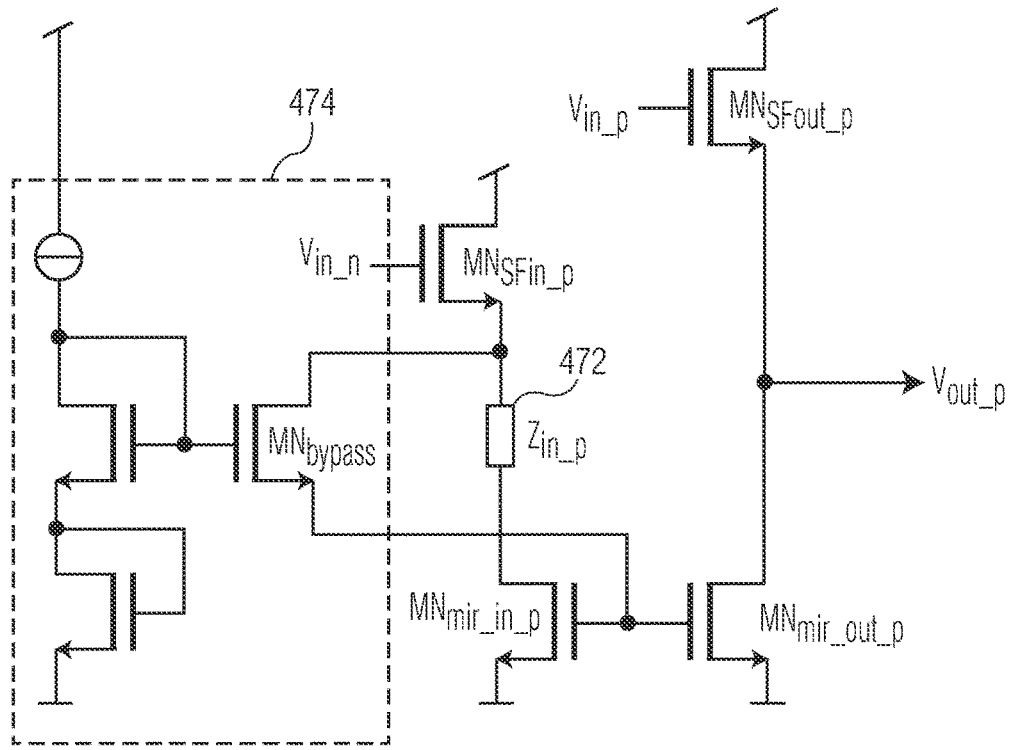

FIGS. 4A-4B illustrates example buffer circuits and resulting signal paths, in accordance with the present disclosure. Bias current levels used to provide high-frequency operation of the feed-forward current branch, e.g., bias current for the source-follower transistor $MN_{SFin\_p}$ and the current mirror diode $MN_{mir\_in\_p}$, can lead to a voltage drop across the resistive circuit, which can prohibit usage of the circuit (e.g., the buffer) at a given supply voltage. Various embodiments can limit the voltage drop by adding a current source across the resistive circuit. FIGS. 4A-4B illustrate example circuits that add a current source.

The buffer circuit 470 illustrated by FIGS. 4A-4B, similarly to FIG. 2, shows one half (e.g., the first circuit 102) of the buffer circuit 100 illustrated by FIG. 1. The components are the same as previously described by FIG. 1 with the addition of a current source circuit 474 that is in parallel with the respective resistive circuit 472. As previously described, in various embodiment, the resistive circuit 476 is replaced by or in series or parallel with an inductive circuit.

As previously described, a load is driven by the first and second output signals of the buffer circuit 470. In a number of above-described embodiments, the first circuit and/or the second circuit include a respective resistive circuit (e.g., 472 in FIGS. 4A-4B) in or along an associated one of the pairs of related signal paths, with the respective resistive circuit being set to a resistance value according to parameters associated with the load. A current source circuit 474 is arranged in parallel to the respective resistive circuit ($R_{in\_p}$) to mitigate a voltage drop across the respective resistive circuit 472. The DC-current is bypassed by the current source circuit 474 (which can be a floating current source) while the signal current is determined by the resistive circuit 472. The $R_{DS}$ of the current source is large compared to the resistive value $R_{in\_p}$ of the resistive circuit 472.

FIG. 4B illustrates a specific example of a current source circuit 474 which includes a bypass circuit. The bypass circuit is used to provide the floating current source. As noted above, the DC-current is bypassed by the current source circuit 474 while the signal current is determined by the resistive circuit 472. The $R_{DS}$ of the bypass circuit (e.g., $MN_{bypass}$) is large compared to the resistive value $R_{in\_p}$ of the resistive circuit 472.

Apart from the dimensions of $MN_{SFin\_p}$, $R_{in\_p}$ and $MN_{mir\_n\_p}$, the DC-current in the feed-forward current path is determined by the DC-voltage at the buffer input node $V_{in\_n}$. To control the current consumption and to provide proper operation over process, supply and temperature variations, the DC-voltage at the LNA-outputs (or other types of circuits) are properly determined.

Figure 5:
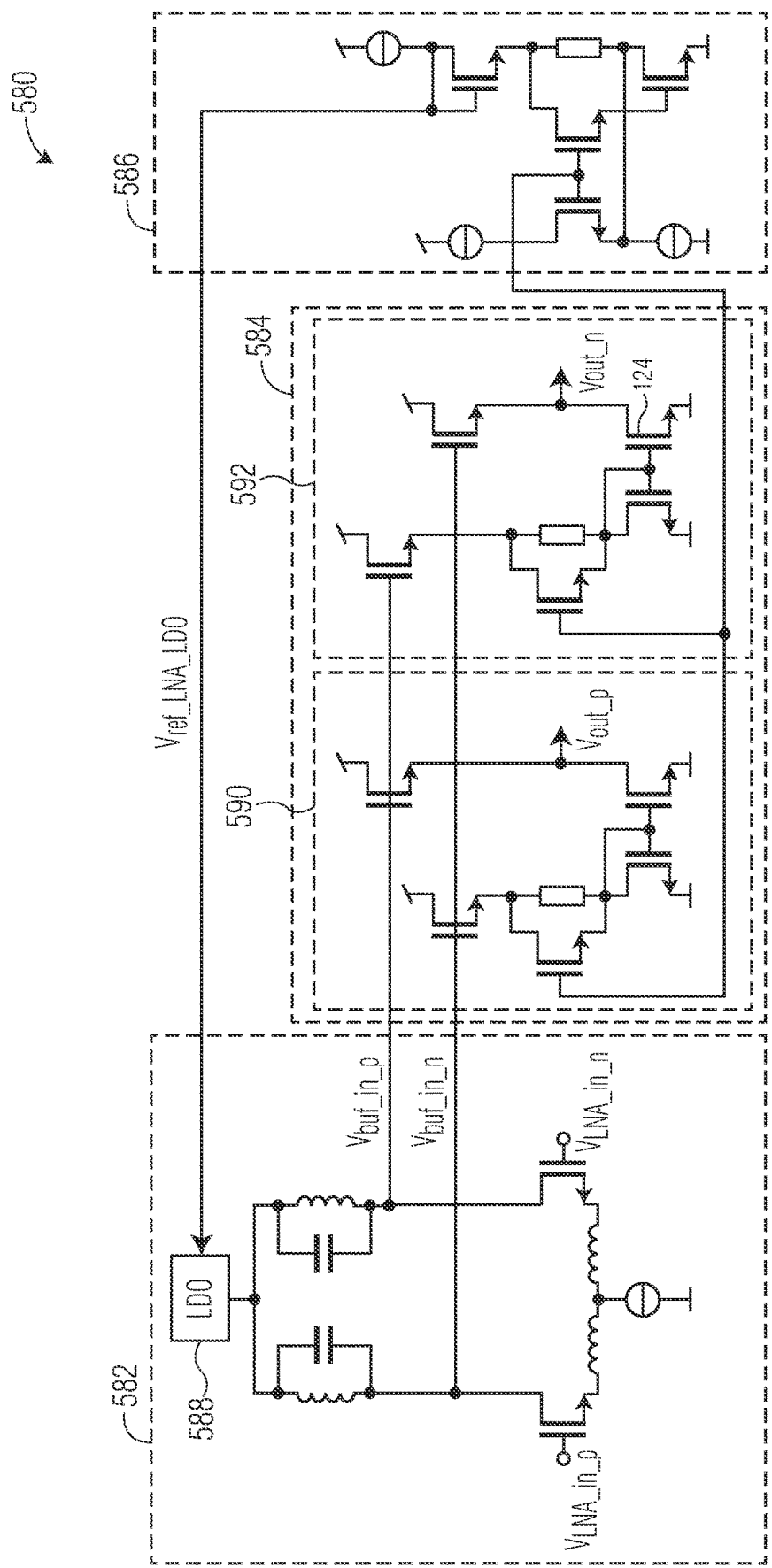
FIG. 5 illustrates example apparatus including a buffer circuit, in accordance with the present disclosure.

FIG. 5 illustrates an example apparatus including a buffer circuit, in accordance with the present disclosure. More specifically, FIG. 5 illustrates an apparatus 580 having a buffer circuit 584 which includes a first circuit 590 and a second circuit 592 and which is coupled to receive output signals from an LNA 582 having an LDO regulator 588, such as the circuit previously described in connection with FIG. 1. As described above, although FIG. 5 illustrates an LNA 582 as the source to the buffer circuit 584, embodiments are not so limited and can include other types of circuitry used to generate output signals for use as the input signals to the buffer circuit 584.

The apparatus 580 includes the components previous described by FIG. 1, and various additional components. For example, the apparatus 580 includes a the LNA 582 including circuitry configured to generate output signals for use as input signals corresponding to the pair of differential input signals and an LDO regulator 588 configured to regulate the DC-voltage of the output signals using a reference voltage signal. The voltage on top of the LNA-tank load in FIG. 5 is controlled by the LDO regulator 588.

In various related embodiments, the apparatus 580 further includes a bias circuit 586. The bias circuit 586 is configured with the first and second circuits 590, 592 of the buffer circuit 584 and the LDO regulator 588 to provide the reference voltage signal to the LDO regulator that is based on a voltage drop of the first and second pair of related signal paths. The reference voltage for the LDO regulator 588 at node $V_{ref\_LNA\_LDO}$ is generated by the bias circuit 586 that mimics the voltage drop of the feed-forward current branch of the buffer circuit 584. The DC-voltage of the LNA outputs $V_{buf\_in\_p}$ and $V_{buf\_in\_p}$ is set to the correct value to get the intended bias currents inside the buffer circuit 584.

In embodiments in which the LNA 582 does not include a tank-circuit, which has minimal DC-voltage drop due to low-resistive inductors and the LNA load consists of resistors, the bias circuit 586 can be adjusted accordingly.

Other alternative embodiments include AC-coupling capacitors between the LNA 582 and the buffer circuit 584. For example, the buffer DC-voltage is set via high-ohmic resistors biased at the intended voltage defined by the buffer bias. In such embodiments, the LNA-signals are capacitively coupled via a high pass (e.g., an RC- or LC-high pass), and the resistors are used to set the DC-level.

Terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, source, and/or other circuit-type depictions (e.g., reference numerals 100 and 240 of FIGS. 1-2 depict a block/module as described herein). Such circuits or circuitry are used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/activities. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described herein is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit). As another example, where the Specification may make reference to a "first circuit" a "second circuit etc., where the circuit might be replaced with terms such as "circuitry" and others, the adjectives "first" and "second" are not used to connote any description of the structure or to provide any substantive meaning; rather, such adjectives are merely used for English-language antecedence to differentiate one such similarly-named structure from another similarly-named.

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. For instance, circuit components illustrated by FIG. 3 (e.g. capacitor 362) and FIGS. 4A-4B (e.g., the current source circuit 474) can be implemented in the circuit arrangement illustrated in FIG. 1 and/or FIG. 5. As another example, the bias circuit 586 illustrated by FIG. 5 can be included in the circuit of FIG. 1. Such modifications do not depart from the true spirit and scope of various aspects of the disclosure, including aspects set forth in the claims

What is claimed is:

1. An apparatus including a buffer circuit coupled to a load, the buffer circuit comprising:
   a first circuit including a first set of transistors respectively configured along a first pair of related signal paths to process related signals, each of the transistors of the first set being configured to be driven in response to two related input signals having different but related phases;
   a second circuit including a second set of transistors respectively configured along a second pair of related signal paths also to process the related signals, each of the transistors of the second set being configured to be driven also in response to the two related input signals having different but related phases;
   respective ones of the transistors of the first set and of the second set being configured to be driven in response to one of the two related input signals and the other of the transistors of the first set and of the second set being configured to be driven in response to the other of the two related input signals; and
   the first circuit configured to generate a first related output signal in response to one path of the first pair of related signal paths and the second circuit configured to generate a second related output signal in response to one path of the second pair of related signal paths, wherein the first and second circuits are configured and arranged to provide a linear transfer function across one of the first and one of the second sets of transistors via one of the first pair and one of the second pair of related signal paths corresponding with the other of the first and second sets of transistors, wherein at least one of the first circuit and the second circuit includes a respective resistor in or along an associated one of the pairs of related signal paths, wherein said respective resistor is set to a resistance value according to parameters associated with the load.

2. The apparatus of claim 1, further including circuitry configured to generate output signals for use as the two related input signals and wherein the two related input signals include a differential pair of signals and the first and second related outputs signals correspond to an amplified version of the differential pair of signals.

3. The apparatus of claim 1, further including the load to be driven by the first and second related output signals, and wherein the first circuit and the second circuit provide the first and second related output signals along associated ones of the first and second pairs of related signal paths with low or minimal output impedance.

4. The apparatus of claim 1, wherein the two related input signals include a differential pair of signals, and wherein the first circuit and the second circuit provide the first and second related output signals along associated ones of the first and second pairs of related signal paths with low or minimal output impedance and without a feedback loop.

5. The apparatus of claim 1, further including the load configured and arranged to be driven by the first and second related output signals.

6. The apparatus of claim 1, further including a low-noise amplifier including circuitry configured to generate output signals for use as the two related input signals corresponding to a differential input signal, and further including the load to be driven by the first and second related output signals.

7. The apparatus of claim 6, wherein the first circuit and the second circuit provide the first and second related output signals along an associated one of the pair of related signal paths without a feedback loop, each of the first and second circuits being configured and arranged to deliver the load current along a respective current path of each of the first and second sets of related pairs of signal paths and provide voltage transfer along a respective voltage path of each of the first and second sets pairs of related signal paths transfer function thereacross.

8. The apparatus of claim 1, further including the load configured and arranged to be driven by the first and second related output signal, wherein at least one of the first circuit and the second circuit includes a respective inductive circuit in or along an associated one of the pair of related signal paths, wherein said respective inductive circuit is set to an inductance value according to parameters associated with the load.

9. An apparatus including a buffer circuit, the buffer circuit comprising:
   a first circuit including a first set of field-effect transistors (FETs) respectively configured along a first pair of related signal paths to process related signals, each of the FETs of the first set being configured to be driven in response to two related input signals having different but related phases;
   a second circuit including a second set of FETs respectively configured along a second pair of related signal paths also to process the related input signals, each of the FETs of the second set being configured to be driven in response to the two related input signals having different but related phases;
   respective ones of the FETs of the first set and of the second set being configured to be driven in response to one of the two related input signals and the other of the FETs of the first set and of the second set being configured to be driven in response to the other of the two related input signals; and
   the first circuit configured to generate a first related output signal in response to one path of the first pair of related signal paths and the second circuit is configured to generate a second related output signal in response to one path of the second pair of related signal paths, wherein the first and second circuits are configured and arranged to provide a linear transfer function across one of the first and one of the second sets of transistors via one of the first pair and one of the second pair of related signal paths corresponding with the other of the first and second sets of transistors;
   wherein at least one of the first circuit and the second circuit includes:
      a respective resistor circuit in or along an associated one of the pairs of related signal paths, wherein the respective resistor circuit is set to a resistance value according to parameters associated with a load to be driven by the first and second related output signals; and
      a capacitor circuit configured and arranged in parallel to the respective resistor circuit and to compensate for signal delay and to at least partially account for impedance and capacitance attributable to the load.

10. The apparatus of claim 9, further including circuitry configured to generate output signals for use as the two related input signals corresponding to a differential input signal.

11. The apparatus of claim 9, wherein the first set of FETs is respectively configured with a current path of the first pair of related signal paths in a first current mirror arrangement.

12. The apparatus of claim 9, wherein the second set of FETs is respectively configured with a current path of the second pair of related signal paths in a second current mirror arrangement.

13. The apparatus of claim 9, the first and second circuits each further include circuitry to mimic a scaled version of the load to be driven by the first and second related output signals.

14. The apparatus of claim 9, wherein each of the FETs is configured as a source-follower transistor having a gate, the source-follower transistors being configured to respond to a respective one of the two related input signals, and further including:

the load to be driven by the first and second related output signals.

15. The apparatus of claim 9, wherein the first set of FETs and the second set of FETS include the first pair of related signal paths in a first current mirror arrangement and the second pair of related signal paths in a second current mirror arrangement, and each of the first circuit and the second circuit further includes a resistor coupled to the first and second current mirror arrangement.

16. The apparatus of claim 9, further including the load configured and arranged to be driven by the first and second related output signals, and wherein the first circuit and the second circuit provide the first and second related output signals along associated ones of the first and second pairs of related signal paths with low or minimal output impedance.

17. The apparatus of claim 9, wherein the first circuit and the second circuit provide the first and second related output signals along associated ones of the first and second pairs of related signal paths with low or minimal output impedance and without a feedback loop.

18. The apparatus of claim 9, further including the load to be driven by the first and second related output signals, wherein at least one of the first circuit and the second circuit includes a respective resistive circuit in or along an associated one of the pair of related signal paths, wherein said respective resistive circuit is set to a resistance value according to parameters associated with the load.

* * * * *